US010743428B2

(12) United States Patent
Cho

(10) Patent No.: US 10,743,428 B2
(45) Date of Patent: Aug. 11, 2020

(54) SLIDABLE DISPLAY DEVICE

(71) Applicant: Samsung Display Co., Ltd., Yongin-si, Gyeonggi-do (KR)

(72) Inventor: Sun Haeng Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/533,645

(22) Filed: Aug. 6, 2019

(65) Prior Publication Data
US 2020/0221585 A1    Jul. 9, 2020

(30) Foreign Application Priority Data

Jan. 3, 2019 (KR) .................. 10-2019-0000767

(51) Int. Cl.
*H05K 5/00* (2006.01)
*H05K 5/02* (2006.01)
*G06F 1/16* (2006.01)

(52) U.S. Cl.
CPC ......... *H05K 5/0017* (2013.01); *G06F 1/1652* (2013.01); *H05K 5/0217* (2013.01)

(58) Field of Classification Search
CPC ... H05K 5/0017; H05K 5/0217; G06F 1/1652
See application file for complete search history.

(56) References Cited

U.S. PATENT DOCUMENTS 9,817,443 B2 * 11/2017 Kim .................. G06F 1/1652
10,143,095 B2 * 11/2018 Kim .................. G06F 1/1652

| 2008/0144265 | A1 * | 6/2008 | Aoki | G06F 1/1601 361/679.04 |
| 2010/0159992 | A1 | 6/2010 | Johansson | |
| 2011/0176260 | A1 * | 7/2011 | Walters | G06F 1/1641 361/679.01 |
| 2013/0058063 | A1 * | 3/2013 | O'Brien | G06F 1/1624 361/807 |
| 2015/0248144 | A1 * | 9/2015 | Hong | G06F 1/1652 361/679.27 |
| 2016/0163242 | A1 * | 6/2016 | Lee | G09F 9/301 40/584 |
| 2016/0209879 | A1 * | 7/2016 | Ryu | G06F 1/1601 |

(Continued)

FOREIGN PATENT DOCUMENTS

| KR | 10-2011-0105814 A | 9/2011 |
| KR | 10-2014-0028216 A | 3/2014 |
| KR | 10-2016-0141255 A | 12/2016 |

*Primary Examiner* — Daniel P Wicklund
*Assistant Examiner* — Sagar Shrestha
(74) *Attorney, Agent, or Firm* — Lewis Roca Rothgerber Christie LLP

(57) ABSTRACT

A slidable display device in which a display panel includes a first area and a second area extending from the first area. A plurality of rollers are inside the housing, which includes an opening. The first area is exposed to the outside through the opening when the second area is stored in the housing. The second area is bent toward a lower portion the first area so as to be located between the plurality of rollers and a lower surface of the housing. The display panel is configured to slide by rotating the plurality of rollers such that the second area is exposed to the outside through the opening or introduced to the inside, and thereby, an area of the display area may be adjusted.

18 Claims, 4 Drawing Sheets

(56) References Cited

U.S. PATENT DOCUMENTS

| | | | |
|---|---|---|---|
| 2016/0216737 A1* | 7/2016 | Hayk | G06F 1/1652 |
| 2016/0324021 A1* | 11/2016 | Takayanagi | G06F 1/1652 |
| 2017/0123536 A1* | 5/2017 | Aurongzeb | H04M 1/0268 |
| 2017/0212556 A1* | 7/2017 | Jovanovic | G06F 1/1652 |
| 2017/0325343 A1* | 11/2017 | Seo | G06F 1/1652 |
| 2018/0049328 A1* | 2/2018 | Choi | H05K 5/0217 |
| 2018/0098440 A1* | 4/2018 | Choi | H05K 5/0017 |
| 2018/0103552 A1* | 4/2018 | Seo | G06F 1/1652 |
| 2019/0033925 A1* | 1/2019 | Hong | E05D 7/00 |

\* cited by examiner

SLIDABLE DISPLAY DEVICE

CROSS-REFERENCE TO RELATED APPLICATION

This application claims priority to and the benefit of Korean Patent Application No. 10-2019-0000767 filed in the Korean Intellectual Property Office on Jan. 3, 2019, the entire contents of which are incorporated herein by reference.

BACKGROUND

1. Field

The present disclosure relates to a slidable display device.

2. Description of the Related Art

As society enters a full-fledged information age, the field of a display device for visually displaying an electrical information signal is rapidly developing. Accordingly, various display devices, for example, a liquid crystal display device (LCD), a field emission display device (FED), an electrophoretic display device (EPD), an electro-wetting display device (EWD), an organic light emitting display device (OLED), and a quantum dot display device (QD), have been developed and commercialized.

The display device includes a display panel in which a display element and a drive element are disposed. The display panel may be manufactured such that an image is displayed by forming a display element, a wire, and the like on a substrate formed of a material having flexibility, even when the display panel is bent like paper.

SUMMARY

An exemplary embodiment of the present disclosure includes a slidable display device in which a display panel includes a first area and a second area extending from the first area. A plurality of rollers are inside the housing, which includes an opening. The first area is exposed to the outside through the opening when the second area is stored in the housing. The second area is bent toward a lower portion the first area so as to be located between the plurality of rollers and a lower surface of the housing. The display panel is configured to sliide by rotating the plurality of rollers such that the second area is exposed to the outside through the opening or introduced to the inside, and thereby, an area of the display area may be adjusted.

According to an exemplary embodiment of the present disclosure, a slidable display device in which a plurality of drive rollers, a plurality of support rollers, and a plurality of side support rollers are arranged between a first area and a second area of a display panel. When the second area is stored in the housing, a rotational force provided by the plurality of drive rollers is stably (e.g., more stably) transferred to the display panel, and the plurality of support rollers may effectively support the slidable display panel.

A slidable display device according to an exemplary embodiment of the present disclosure includes a display panel including a first area and a second area extending from a first side of the first area, a housing defining an opening at an upper portion thereof and configured to store the second area, a plurality of drive rollers inside the housing, a plurality of support rollers including a plurality of upper support rollers between the plurality of drive rollers and including a plurality of lower support rollers between the plurality of drive rollers and a lower surface of the housing, and a side support roller between the plurality of drive rollers and a side surface of the housing. The first area is on the upper support roller and is exposed to the outside through the opening when the second area is stored in the housing. When the second area is stored in the housing, the second area is bent to a lower portion of the first area to face the lower portion of the first area and is between the side support roller and the side surface of the housing and between the lower support roller and the lower surface of the housing. The first area is configured to slide by rotating the plurality of drive rollers such that at least a portion of the second area adjacent to the first area is exposed to the outside through the opening or is stored inside the housing.

The first area and the at least a portion of the second area that is exposed to the outside through the opening may define a display area, and the display area may be adjusted in area as the at least a portion of the second area is exposed outside of the housing or stored inside the housing.

The first area and the at least a portion of the second area that is exposed to the outside may define one display area.

The display area may be configured to display one image or a plurality of divided images.

The first area may include a rigid substrate or a flexible substrate, and the second area may include a flexible substrate.

The first area may include a second side and a third side that are adjacent to the first side and face each other. The plurality of drive rollers, the plurality of support rollers, and the side support roller may each be located in a first roller area adjacent to the second side and a second roller area adjacent to the third side.

Each of the plurality of drive rollers may be connected to one motor.

Respective ones of the plurality of drive rollers may be connected to different motors.

The plurality of drive rollers and the plurality of support rollers may be alternately arranged along a sliding direction in which the first area is configured to slide, and may be coupled with each other.

The display panel may be in contact with the plurality of support rollers except for the plurality of drive rollers, and the plurality of support rollers may transfer rotational forces of the plurality of drive rollers to the display panel.

When the plurality of drive rollers rotate in a first direction, the plurality of support rollers may rotate in a second direction opposite to the first direction, and the at least a portion of the second area may be exposed to the outside through the opening. When the plurality of drive rollers rotate in the second direction, the plurality of support rollers may rotate in the first direction, and the at least a portion of the second area may be stored inside of the housing through the opening.

The plurality of drive rollers and the plurality of support rollers may each include gears on outer peripheral surfaces thereof, respectively, the gears of the plurality of drive rollers and the gears of the plurality of upper support rollers may be engaged with each other, and the gears of the plurality of drive rollers and the gears of the plurality of lower support rollers may be engaged with each other.

The display panel may include a gear on an inner surface thereof and in contact with the plurality of support rollers, and the gear of the display panel may be engaged with the gears of the plurality of support rollers.

The side support roller may include a gear on an outer peripheral surface thereof, and the gear of the side support roller and the gear of the display panel may be engaged with each other.

The side support roller may be independent of the plurality of drive rollers and the plurality of support rollers.

The slidable display device may further include a first coating layer on each of outer peripheral surfaces of the plurality of drive rollers in contact with the plurality of support rollers; and a second coating layer on each of outer peripheral surfaces of the plurality of support rollers in contact with the plurality of drive rollers. A friction coefficient between the first coating layer and the second coating layer may be greater than friction coefficients between the plurality of drive rollers and the plurality of support rollers.

The slidable display device may further include a third coating layer on an inner surface of the display panel in contact with the plurality of support rollers and the side support roller; and a fourth coating layer on an outer peripheral surface of the side support roller in contact with the display panel. The friction coefficient between the third coating layer and the fourth coating layer may be greater than a friction coefficient between the display panel and the side support roller. A friction coefficient between the third coating layer and the second coating layer may be greater than friction coefficients between the display panel and the plurality of support rollers.

The first coating layer, the second coating layer, the third coating layer, and the fourth coating layer may be formed of at least one of rubber or silicone.

According to embodiments of the present disclosure, as a plurality of rollers is driven, at least a portion of a second area of a display panel is exposed to the outside of a housing or is introduced into the housing, and thereby, an exposed area of the display area may be adjusted.

According to embodiments of the present disclosure, because a plurality of rollers are located between a first area and a second area of a display panel when the second area is stored in a housing, the display panel may be stably slid and a thickness of a display device may be reduced (e.g., minimized).

Effects according to embodiments of the present disclosure are not limited by the examples above, and more various effects are included in the present specification.

DETAILED DESCRIPTION

Figure 1:
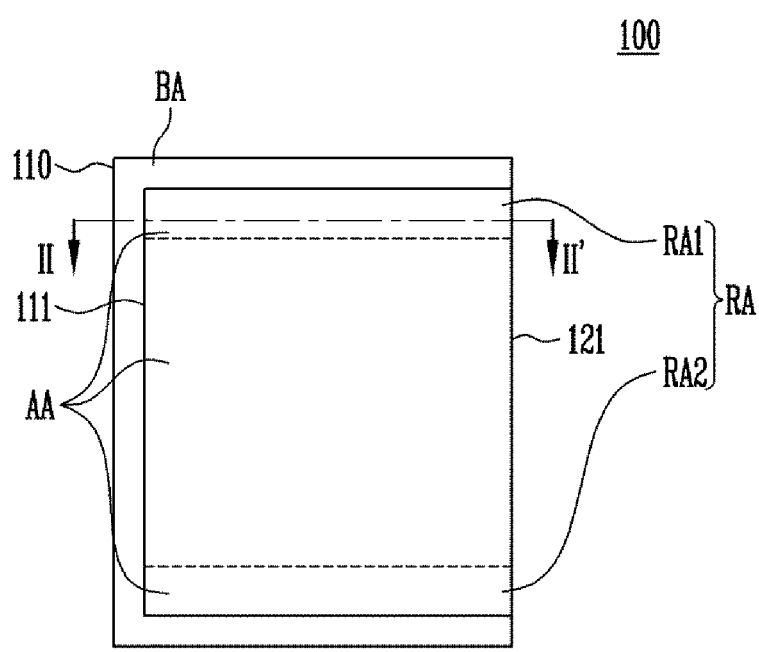
FIG. 1 is a plan view of a slidable display device according to an exemplary embodiment of the present disclosure.

Aspects of embodiments of the present disclosure and will become apparent with reference to the exemplary embodiments described below with reference to the accompanying drawings. The present disclosure may, however, be embodied in many different forms and should not be construed as being limited to the exemplary embodiments set forth herein. The exemplary embodiments herein are provided such that the present disclosure will be thorough and complete and are provided so that those of ordinary skill in the art may fully understand the scope of the present disclosure, and the present disclosure is only defined by the scope of the claims appended hereto and their equivalents. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." In addition, the use of alternative language, such as "or," when describing embodiments of the present disclosure, refers to "one or more embodiments of the present disclosure" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

It is to be understood that each of the features of the various exemplary embodiments of the present disclosure may be coupled or combined with each other partially or entirely, and may be interlocked and driven technically as can be appreciated by those of ordinary skill in the art. The respective exemplary embodiments are independently feasible and are also feasible in conjunction with each other.

Hereinafter, exemplary embodiments of the present disclosure are described with reference to the accompanying drawings.

Figure 2:
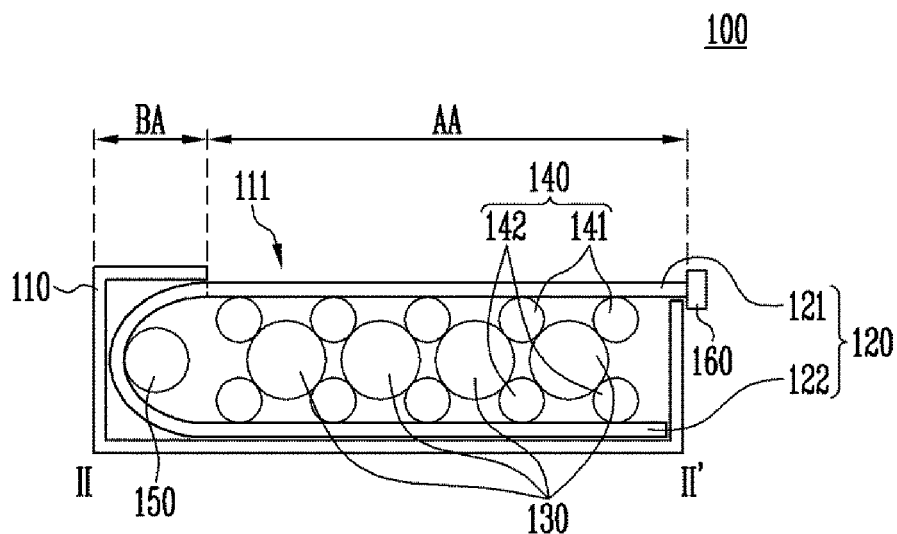
FIG. 2 is a cross-sectional view taken along the line II-II' of FIG. 1.

FIG. 1 is a plan view of a slidable display device according to an exemplary embodiment of the present disclosure. FIG. 2 is a cross-sectional view taken along the line II-II' of FIG. 1.

Referring to FIGS. 1 and 2, a slidable display device 100 includes a housing 110, a display panel 120, a plurality of drive rollers 130, a plurality of support rollers 140, a side support roller 150, and a handle 160. The handle 160 is not shown in FIG. 1.

The housing 110 houses and protects various elements (e.g., configuration elements) of the slidable display device 100. The housing 110 surrounds the display panel 120, the plurality of drive rollers 130, the plurality of support rollers 140, the side support roller 150, a battery, and various circuits, which may be stored in the housing.

The housing 110 includes an opening area (e.g., an opening) 111. The opening area 111 connects the inside of the housing 110 to the outside of the housing 110. A portion of the display panel 120 may be exposed to the outside through the opening area 111 of the housing 110. Other portions (e.g., remaining portions) of the display panel 120, except for the portion of the display panel 120 that is exposed to the outside, and other configuration elements of the slidable display device 100 may be stored in the housing 110 so as not to be exposed (e.g., exposed to the outside).

The housing 110 includes a bezel area BA. The bezel area BA surrounds the display panel 120 exposed through the opening area 111 in a top view of a slidable display device 100. A thickness of the bezel area BA of the housing 110 may be adjusted. The thickness of the bezel area BA is not limited to the thickness illustrated in FIG. 1. For example, according to embodiments, the thickness of the bezel area BA may be reduced or minimized, and a bezel-less display device may be implemented. For example, only the slidable display device 100 may be visually recognized in a plan view of the display panel 120, and the housing 110 may be disposed to surround a side surface and a bottom surface of the slidable display device 100.

The display panel 120 includes a first area 121 and a second area 122 extending from the first area 121. The first area 121 may be exposed to the outside of the housing 110, and the second area 122 may be stored in the housing 110 or exposed to the outside of the housing 110 according to sliding of the display panel 120.

The plurality of drive rollers 130, the plurality of support rollers 140, and the side support roller 150 are arranged in a roller area RA. The roller area RA includes a first roller area RA1 and a second roller area RA2. Referring to FIG. 1, the first area 121 includes a first side, a second side, and a third side. The first side and second side are adjacent to the third side and face each other. The first roller area RA1 overlaps the first area 121 adjacent to (or near) the first side of the first area 121. The second roller area RA2 overlaps the first area 121 adjacent to (or near) the second side of the first area 121. The first roller area RA1 and the second roller area RA2 may extend in a direction (e.g., a sliding direction) along which the display panel 120 is slid (or slides or is configured to slide).

The plurality of drive rollers 130 are stored in the housing 110 and are arranged in the first roller area RA1 and the second roller area RA2, respectively. The plurality of drive rollers 130 generate a rotational force for sliding the display panel 120. The plurality of drive rollers 130 may be arranged side by side in the sliding direction (or the direction in which the display panel 120 is configured to slide) in the first roller area RA1 and the second roller area RA2, respectively. The plurality of drive rollers 130 may be arranged such that outer peripheral surfaces thereof are adjacent to each other. The plurality of drive rollers 130 may not contact each other.

According to some embodiments, the slidable display device 100 may include four drive rollers 130 in each of the first roller area RA1 and the second roller area RA2, as illustrated in FIG. 2. However, the number of the plurality of drive rollers 130 is not limited thereto and may be changed depending on lengths of the first roller area RA1 and the second roller area RA2, and depending on a thickness of the slidable display device 100. For example, the number of the plurality of drive rollers 130 may be increased by increasing the length of the roller area RA. In addition, as the thickness of the slidable display device 100 decreases, diameters of the plurality of drive rollers 130 may decrease, and the number of the plurality of drive rollers 130 may thus increase.

The plurality of drive rollers 130 may rotate in the same direction and may generate a rotational force. Each of the plurality of drive rollers 130 may be connected to a plurality of motors (e.g., a plurality of other motors), and when the plurality of motors are driven, the drive rollers 130 connected to the respective motors may rotate in a specific direction. Each of the plurality of motors may transmit the same force to the plurality of drive rollers 130, and the plurality of drive rollers 130 may rotate in the same direction and at the same speed to generate a rotational force.

The plurality of drive rollers 130 may be connected to the plurality of other motors, but the present disclosure is not limited thereto. For example, the plurality of drive rollers 130 may be connected to one motor. In some embodiments, a force generated by the one motor may be transmitted to each of the plurality of drive rollers 130 in a divided manner.

The plurality of support rollers 140 may be stored in the housing 110 and may be arranged at upper and lower portions of the plurality of drive rollers 130. The plurality of support rollers 140 transmit the rotational force generated by the plurality of drive rollers 130 to the display panel 120 and support the display panel 120. The plurality of support rollers 140 includes a plurality of upper support rollers 141 and a plurality of lower support rollers 142.

The plurality of upper support rollers 141 may be arranged between the plurality of drive rollers 130 and the opening area 111 of the housing 110. In a planar view, the plurality of upper support rollers 141 are alternately arranged with the plurality of drive rollers 130 in an extension direction of the roller area RA (or the sliding direction). A first upper support roller 141 may be in contact with an adjacent drive roller 130 and the adjacent drive roller 130 may be in contact with an adjacent second upper support roller 141. Accordingly, the plurality of upper support rollers 141 and the plurality of drive rollers 130 may be integrated with each other and in contact with each other.

The plurality of lower support rollers 142 may be arranged between the plurality of drive rollers 130 and a lower surface of the housing 110. In a planar view, the plurality of lower support rollers 142 are alternately arranged with the plurality of drive rollers 130 in the extension direction of the roller area RA (or the sliding direction). A first lower support roller 142 may be in contact with an adjacent drive roller 130 and the adjacent drive roller 130 may be in contact with an adjacent second lower support roller 142. Accordingly, the plurality of lower support rollers 142 and the plurality of drive rollers 130 may be integrated with each other and in contact with each other.

The plurality of drive rollers 130, the plurality of upper support rollers 141, and the plurality of lower support rollers 142 may all be coupled (e.g., operationally coupled) to be driven. For example, two adjacent drive rollers 130 may be coupled with the upper support roller 141 and the lower support roller 142 disposed between the two drive rollers 130 and may rotate in a same direction at a same speed as each other. The plurality of support rollers 140 that are in contact with the two adjacent drive rollers 130 may rotate in a direction opposite to the direction in which the drive roller 130 rotates and may all rotate at a same speed. As all of the plurality of drive rollers 130 and all of the plurality of support rollers 140 are coupled with each other, the plurality of drive rollers 130 may all rotate in the same direction at the same speed. All of the plurality of support rollers 140 may rotate in the same direction at the same speed. Accordingly, each of the plurality of support rollers 140 may transmit the same rotational force to the display panel 120.

The side support roller 150 may be disposed between the plurality of drive rollers 130 and a side surface of the housing 110. The side support roller 150 may be disposed in the first roller area RA1 and the second roller area RA2. The side support roller 150 may be spaced apart from the plurality of drive rollers 130 and the plurality of support rollers 140 between the plurality of drive rollers 130 and the side surface of the housing 110. The side support roller 150 may overlap the bezel area BA of the housing 110 without overlapping with the opening area 111 of the housing 110. However, the present disclosure is not limited thereto, and for example, when a thickness of the bezel area BA is reduced, at least a portion of the side support roller 150 may overlap the opening area 111.

The side support roller 150 may be disposed independently of the plurality of drive rollers 130 and the plurality of support rollers 140. The side support roller 150 may not be in contact with the plurality of drive rollers 130 and the plurality of support rollers 140. Accordingly, the side support roller 150 may not be influenced by rotation of the plurality of drive rollers 130 and rotation of the plurality of support rollers 140. The side support roller 150 may support an inner surface of the display panel 120 and may be rotated by a friction force with the display panel 120 according to sliding of the display panel 120. The side support roller 150 may not be connected to the motor so as to not generate a rotational force. However, the present disclosure is not limited thereto, and the side support roller 150 may be connected to a separate motor to generate the rotational force, for example.

The display panel 120 is a configuration element in which an image is displayed (e.g., the display panel 120 is configured to display an image). In the display panel 120, a plurality of pixels, which are minimum units for emitting light, may be defined. The plurality of pixels may include a red pixel, a green pixel, and a blue pixel. A plurality of signal lines may be disposed on the display panel 120. The plurality of signal lines may include a plurality of data lines and a plurality of gate lines. The plurality of data lines may extend in one direction to transfer data signals to the plurality of pixels, and the plurality of gate lines may extend in a direction different from the plurality of data lines to transmit gate signals to the plurality of pixels. The plurality of data lines and the plurality of gate lines may extend vertically, but the present disclosure is not limited thereto.

As discussed above, the display panel 120 includes the first area 121 and the second area 122 extending from the first area 121. The first area 121 may be exposed to the outside of the housing 110, and the second area 122 may be stored in the housing 110 or may be exposed to the outside of housing 110 according to sliding of the display panel 120. The first area 121 of the display panel 120 may be a display area AA, which is configured to display an image.

The first area 121 may be exposed to the outside so as to correspond to the opening area 111 of the housing 110, and may be disposed on the plurality of upper support rollers 141 when the second area 122 is stored in the housing 110. A lower surface of the first area 121 may receive a rotational force in contact with the plurality of upper support rollers 141 and may be supported by the plurality of upper support rollers 141. The plurality of drive rollers 130 and the plurality of support rollers 140 may be disposed under the first area 121 when the second area 122 is stored in the housing 110. The first area 121 may not be in contact with the plurality of drive rollers 130, and the plurality of upper support rollers 141 may transfer a rotational force of the plurality of drive rollers 130 to the first area 121.

The second area 122 may extend to one side (e.g., a fourth side) of the first area 121, may be bent to a lower portion of the first area 121, and may further extend to the lower portion of the first area 121 when the second area 122 is stored in the housing 110. Accordingly, the second area 122 disposed under the first area 121 may face the first area 121.

The second area 122 may be disposed in an extended manner between the side support roller 150 and the side surface of the housing 110, and between the plurality of lower support rollers 142 and a lower surface of the housing 110 when the second area 122 is stored in the housing 110. An inner surface of a bent portion of the second area 122 may be in contact with the side support roller 150 and may be supported by the side support roller 150. A portion of the second area 122 facing the first area 121 may receive a rotational force in contact with the plurality of lower support rollers 142 and may be supported by a plurality of the lower support rollers 142. Accordingly, the plurality of drive rollers 130 and the plurality of support rollers 140 may be disposed on an upper portion of the second area 122 when the second area 122 is stored in the housing 110. The second area 122 may not be in contact with the plurality of drive rollers 130, and the plurality of lower support rollers 142 may transfer the rotational force of the plurality of drive rollers 130 to the second area 122.

The display panel 120 may include a flexible substrate. For example, the first area 121 and the second area 122 of the display panel 120 may be manufactured by forming a plurality of pixels, a plurality of signal lines, and the like on one flexible substrate. The display panel 120 may include a flexible substrate formed of a plastic material having flexibility and thus may be able to be freely bent. For example, the display panel 120 may include a flexible substrate formed of a plastic material such as polyimide. The second area 122 may be bent to a lower portion of the first area 121 by including the flexible substrate, and when the second area 122 is exposed to the outside of the housing 110 or is introduced to the inside of the housing 110, configuration elements disposed in the second area 122 may not be damaged, or the likelihood of damage thereto may be reduced.

In the display panel 120, the first area 121 and the second area 122 in their entireties may include a flexible substrate, but the present disclosure is not limited thereto. For example, the first area 121 of the display panel 120 may include a rigid substrate and the second area 122 may include a flexible substrate. In embodiments wherein the second area 122 includes the flexible substrate, the display panel 120 may be bent freely when slid. In embodiments wherein the first area 121 includes the rigid substrate, the display panel may not be bent freely. Accordingly, even when at least a portion of the second area 122 is exposed to the outside of the housing 110 or introduced into the housing 110 by sliding the display panel 120, the first area 121 may maintain a flat state.

The handle 160 may be disposed on the other side (e.g., the third side) of the first area 121 of the display panel 120, which faces the fourth side adjacent to the second area 122. The handle 160 may be disposed for the sake of a user's convenience when the display panel 120 is slid (or slides). For example, when the first area 121 includes a flexible substrate, the slidable first area 121 may be bent or folded without maintaining a flat state during sliding of the display panel 120. According to embodiments, a user may fix the first area 121 in a desired shape using the handle 160 disposed on the third side of the first area 121. Although the handle 160 is illustrated as being disposed in the first area 121 in FIG. 2, the handle 160 may not be disposed in the first area 121 according to embodiments.

Figure 3:
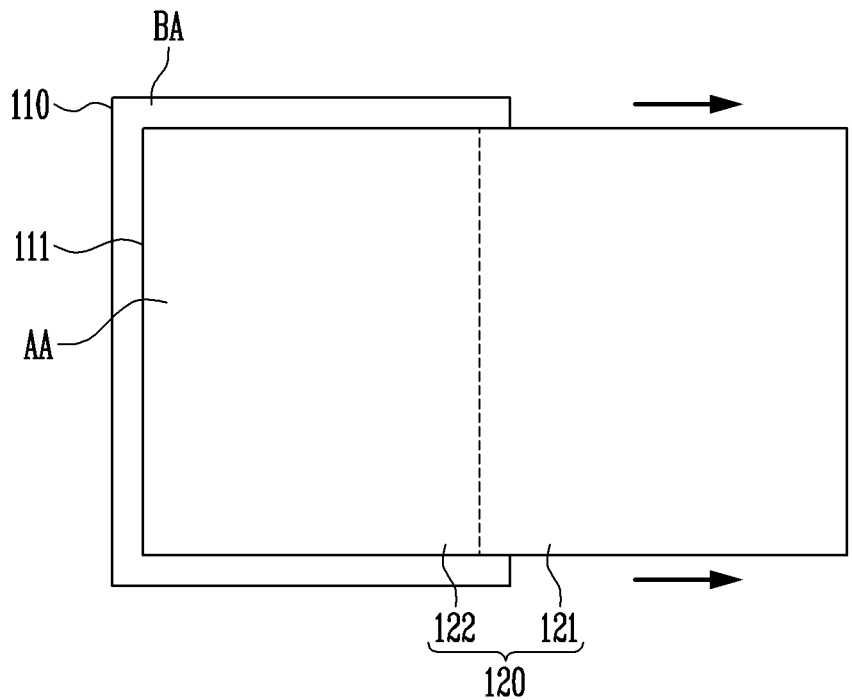
FIG. 3 is a plan view of the slidable display device according to an exemplary embodiment of the present disclosure.
Figure 4:
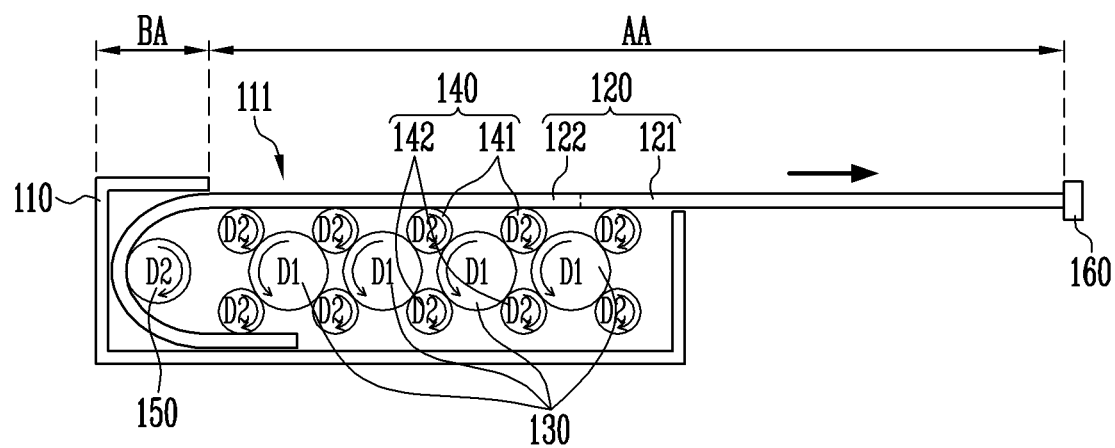
FIG. 4 is a cross-sectional view of the slidable display device of FIG. 3.
Figure 5:
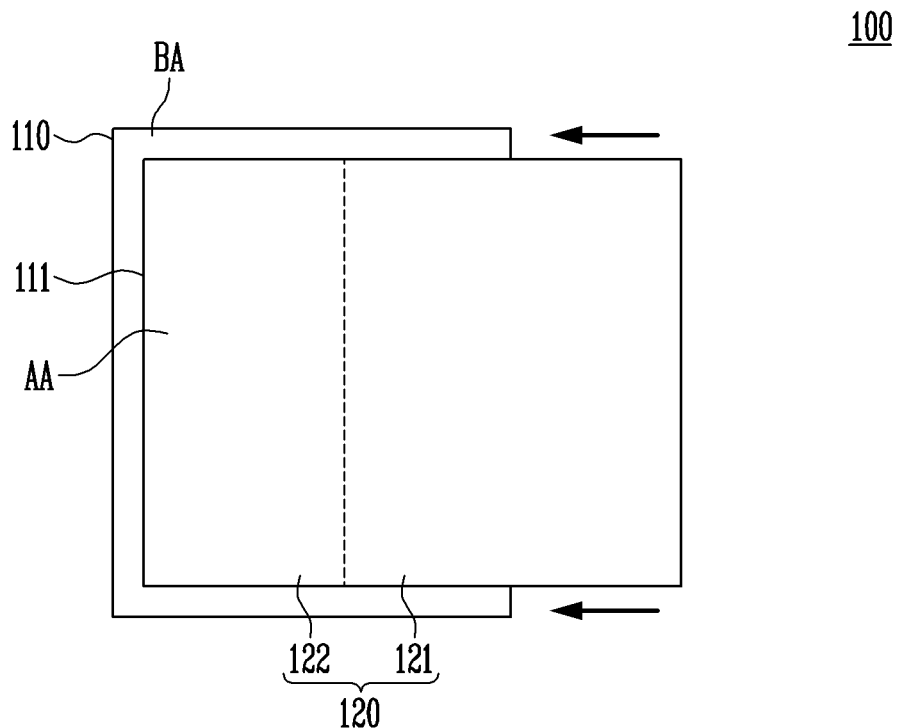
FIG. 5 is a plan view of the slidable display device according to an exemplary embodiment of the present disclosure.
Figure 6:
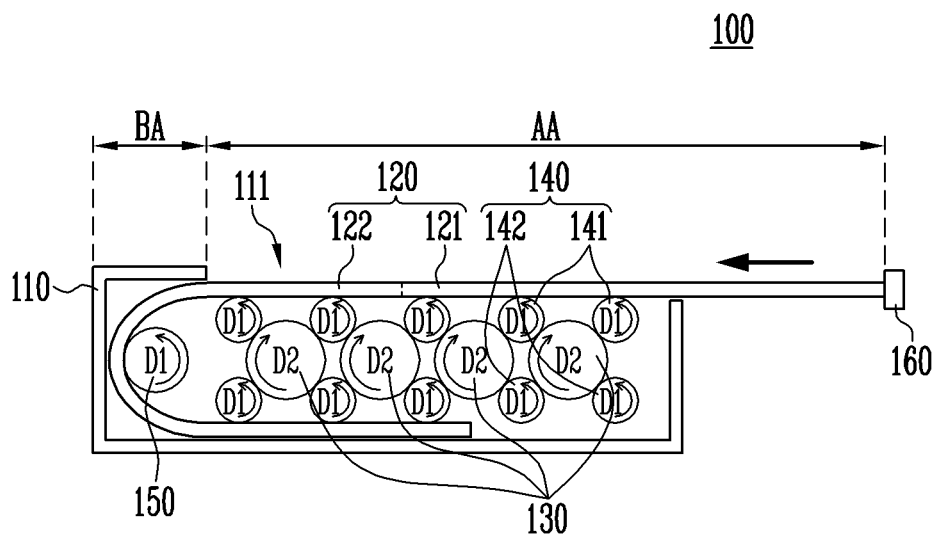
FIG. 6 is a cross-sectional view of the slidable display device of FIG. 5.

FIG. 3 is a plan view of the slidable display device 100 according to an exemplary embodiment of the present disclosure. FIG. 4 is a cross-sectional view of the slidable display device 100 of FIG. 3. FIG. 5 is a plan view of the slidable display device 100 according to an exemplary embodiment of the present disclosure. FIG. 6 is a cross-sectional view of the slidable display device 100 of FIG. 3. FIGS. 3-6 are diagrams illustrating a sliding process of the display panel 120 of the slidable display device 100 of FIGS. 1 and 2. Because the slidable display device 100 of FIGS. 3-6 is substantially the same as the slidable display device 100 of FIGS. 1 and 2, duplicate description thereof may be omitted.

Referring to FIGS. 3 and 4, the plurality of drive rollers 130 rotate in a first direction D1. The two adjacent drive rollers 130 of the plurality of drive rollers 130 may be coupled to each other by the support roller 140 disposed therebetween, and the plurality of drive rollers 130 may all rotate at the same speed in the first direction D1.

The plurality of upper support rollers 141 and the plurality of lower support rollers 142 in contact with the plurality of drive rollers 130 rotate as the plurality of drive rollers 130 rotate in the first direction D1. Each of the plurality of upper support rollers 141 and the plurality of lower support rollers 142 may respectively be in contact with the plurality of drive rollers 130. The plurality of upper support rollers 141 and the plurality of lower support rollers 142 may rotate in a second direction D2 opposite to the first direction D1 when (or as) the plurality of drive rollers 130 rotate in the first direction D1.

When the plurality of support rollers 140 rotate in the second direction D2, the second area 122 stored in the housing 110 is exposed to the outside through the opening area 111 of the housing 110. For example, an inner surface of the display panel 120 may be in contact with the plurality of support rollers 140, and when the plurality of support rollers 140 rotate in the second direction D2, the display panel 120 may be slid by a frictional force. The side support roller 150 may rotate in the second direction D2 while supporting the display panel 120. At least a portion of the second area 122 disposed in the housing 110 may be exposed to the outside through the opening area 111 of the housing 110 as the display panel 120 is slid (or slides). As a rotation speed of the plurality of drive rollers 130 is adjusted, an area (e.g., portion) of the second area 122 exposed to the outside may be adjusted.

An image may be displayed in the second area 122 that is exposed to the outside. Accordingly, the display area AA may be extended by an area corresponding to the second area 122 exposed to the outside and may include the first area 121 and the second area 122 exposed to the outside. The first area 121 and the second area 122 that is exposed to the outside may configure (or form) one display area AA. The first area 121 and the second area 122 which is exposed to the outside may from one display area AA and may display one image (or the same image). However, the number of images displayed by one display area AA is not limited thereto. For example, the display area AA may be divided into a plurality of areas in the extension direction to display a plurality of images that are different from each other.

Referring to FIGS. 5 and 6, the plurality of drive rollers 130 rotate in the second direction D2. The plurality of drive rollers 130 may be coupled with each other by the plurality of support rollers 140, and each of the plurality of drive rollers 130 may rotate in the second direction D2 at the same speed.

When the plurality of drive rollers 130 rotate in the second direction D2, the plurality of upper support rollers 141 and the plurality of lower support rollers 142 in contact with the plurality of drive rollers 130 rotate. The plurality of upper support rollers 141 and the plurality of lower support rollers 142 may rotate in the first direction D1 when (or as) the plurality of drive rollers 130 rotate in the second direction D2.

When the plurality of support rollers 140 rotates in the first direction D1, the second area 122 exposed to the outside of the housing 110 is introduced to the inside through the opening area 111 of the housing 110. When the plurality of support rollers 140 rotate in the first direction D1, the display panel 120 may be slid by a frictional force between the plurality of support rollers 140 and the display panel 120, and the second area 122 may be introduced into the housing 110. According to embodiments, the side support roller 150 may rotate in the first direction D1 while supporting the display panel 120 which is slidable.

When the second area 122 is introduced into the housing 110, an area of the expanded display area AA may be reduced. When the second area 122 in its entirety is introduced into the housing 110, the display area AA may include only the first area 121.

In the slidable display device 100 according to an exemplary embodiment of the present disclosure, the display panel 120 includes the first area 121 exposed to the outside through the opening area 111 of the housing 110 and the second area 122 disposed inside the housing 110, extended from the first area 121, and bent to a lower portion of the first area 121. According to embodiments, the plurality of drive rollers 130, the plurality of support rollers 140, and the side support roller 150 may be arranged in the housing 110. The first area 121 is disposed to correspond to the opening area 111 of the housing 110 to be exposed to the outside and is disposed to be in contact with the plurality of upper support rollers 141 on the plurality of upper support rollers 141 when the second area 122 is stored in the housing 110. In addition, the bent portion of the second area 122 is in contact with the side support roller 150, and a portion facing the first area 121 is in contact with the lower support roller 142 under the plurality of lower support rollers 142. Accordingly, when the second area 122 is stored in the housing 110, the plurality of drive rollers 130 and the plurality of support rollers 140 may be disposed between the first area 121 and the second area 122. When the plurality of drive rollers 130 are driven, the plurality of support rollers 140 may transfer rotational forces of the plurality of drive rollers 130 to the display panel 120, and the display panel 120 may be slid. When the display panel 120 is slid (or slides), the second area 122 stored in the housing 110 may be slid to be exposed to the outside through the opening area 111 of the housing 110, and the display area AA may include the first area 121 and the second area 122 that is extended and exposed to the outside. In addition, when the plurality of drive rollers 130 rotate in an opposite direction (e.g., the second direction D2), the second area 122 exposed to the outside may be introduced into the housing 110 through the opening area 111 of the housing 110 again, and the expanded display area AA may be reduced to the first area 121. As described above, in the slidable display device 100 according to an exemplary embodiment of the present disclosure, at least a portion of the second area 122 may be exposed to the outside of the housing 110 or introduced into the housing 110 again by the plurality of drive rollers 130, the plurality of support rollers 140 and the side support roller 150, and thereby, an area of the display area AA of the slidable display device 100 may be adjusted.

In addition, in the slidable display device 100 according to an exemplary embodiment of the present disclosure, the plurality of drive rollers 130, the plurality of support rollers 140, and the side support roller 150 are arranged in the housing 110. By arranging (or utilizing) the plurality of drive rollers 130, a greater rotational force is generated as compared with a display device where one drive roller 130 is disposed, and thereby, the display panel 120 may be effectively slid. In addition, by arranging (or utilizing) the plurality of drive rollers 130, it is possible to generate a rotational force capable of effectively sliding the display panel 120 even when a size of the drive roller 130 is reduced. Thus, the size of the drive roller 130 may be reduced, and a distance (e.g., a separated distance) between the first area 121 and the second area 122 may be reduced. A thickness of the slidable display device 100 may thus be reduced (or minimized).

Figure 7:
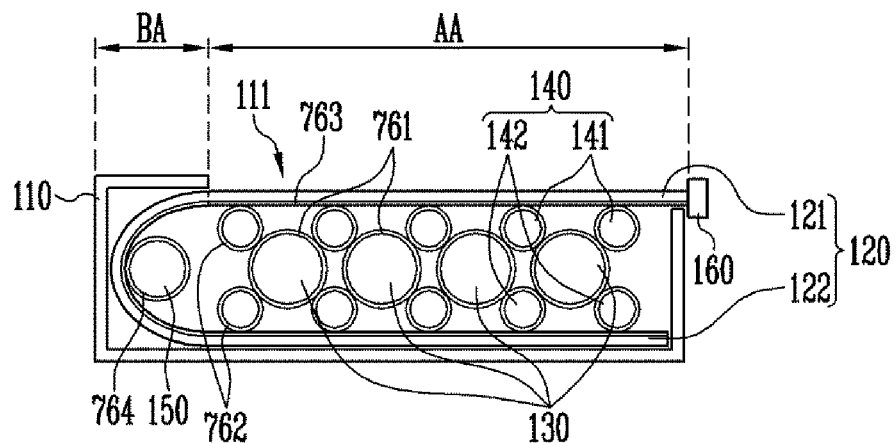
FIG. 7 is a cross-sectional view of a slidable display device according to an exemplary embodiment of the present disclosure.

FIG. 7 is a cross-sectional view of a slidable display device 700 according to an exemplary embodiment of the present disclosure. The slidable display device 700 of FIG. 7 is substantially the same as the slidable display device 100 of FIGS. 1-6, except that the slidable display device 700 further includes a first coating layer 761, a second coating layer 762, a third coating layer 763, and a fourth coating layer 764. As such, duplicate descriptions of like elements may be omitted.

Referring to FIG. 7, the first coating layer 761 may be formed on an outer peripheral surface of each of the plurality of drive rollers 130. The first coating layer 761 increases friction coefficients of the outer peripheral surfaces of the plurality of drive rollers 130. The first coating layer 761 may be disposed on each of the outer peripheral surfaces of the plurality of drive rollers 130 in contact with the plurality of upper support rollers 141 and the plurality of lower support rollers 142.

The second coating layer 762 may be formed on an outer peripheral surface of each of the plurality of support rollers 140. The second coating layer 762 increases friction coefficients of the outer peripheral surfaces of the plurality of support rollers 140. The second coating layer 762 may be disposed on each of the outer peripheral surfaces of the plurality of upper support rollers 141 in contact with the plurality of drive rollers 130, and on each of the outer peripheral surfaces of the plurality of lower support rollers 142 in contact with the plurality of drive rollers 130.

The first coating layer 761 formed on each of the outer peripheral surfaces of the plurality of drive rollers 130 may be in contact with the second coating layer 762 formed on each of the outer peripheral surfaces of the plurality of upper support rollers 141 and the second coating layer 762 formed on each of the outer peripheral surfaces of the plurality of lower support rollers 142. Accordingly, the plurality of drive rollers 130 are not in direct contact with the plurality of support rollers 140, the first coating layer 761 disposed on each of the outer peripheral surfaces of the plurality of drive rollers 130 is in contact with the second coating layer 762 formed on each of the outer peripheral surfaces of the plurality of support rollers 140, and the rollers may thus be engaged with each other to rotate.

A friction coefficient between the first coating layer 761 and the second coating layer 762 may be greater than friction coefficients between the plurality of drive rollers 130 and the plurality of support rollers 140. The first coating layer 761 and the second coating layer 762 may be formed of at least one of rubber or silicone, and the friction coefficient between the first coating layer 761 and the second coating layer 762 may be greater than the friction coefficients between the plurality of drive rollers 130 and the plurality of support rollers 140. Accordingly, when the plurality of drive rollers 130 and the plurality of support rollers 140 are engaged with each other to rotate, the first coating layers 761 come into contact with the second coating layers 762, respectively, and thus frictional forces between the plurality of support rollers 140 and the plurality of support rollers 140 may increase.

A third coating layer 763 is formed on an inner surface (or lower surface) of the display panel 120. The third coating layer 763 increases a friction coefficient of the inner surface of the display panel 120. The third coating layer 763 may be disposed on the inner surface of the display panel 120 in contact with the plurality of drive rollers 130, the plurality of support rollers 140, and the side support rollers 150. The third coating layer 763 may be formed on the inner surface of the display panel 120 in its entirety, and in some embodiments, the third coating layer 763 may be formed only on portions of the inner surface corresponding to an area in contact with the plurality of drive rollers 130, the plurality of support rollers 140, and the side support roller 150, e.g., the roller area RA. The first area 121 and the second area 122 of the display panel 120 may not be in direct contact with the plurality of drive rollers 130, the plurality of support rollers 140, and the side support rollers 150, and in some embodiments, the first area 121 and the second area 122 may be in contact with the plurality of drive rollers 130, the plurality of support rollers 140, and the side support rollers 150.

A friction coefficient between the third coating layer 763 and the second coating layer 762 may be greater than friction coefficients between the display panel 120 and the plurality of support rollers 140. The third coating layer 763 may be formed of at least one of rubber or silicone, and the friction coefficient between the third coating layer 763 and the second coating layer 762 may be greater than the friction coefficients between the display panel 120 and the plurality of support rollers 140. Accordingly, if the display panel 120 is slid (or slides) as the plurality of support rollers 140 rotate, the third coating layer 763 formed on the inner surface of the display panel 120 comes into contact with the second coating layer 762 formed on each of the outer peripheral surfaces of the plurality of support rollers 140, and thus the frictional forces between the display panel 120 and the plurality of support rollers 140 may increase.

A fourth coating layer 764 is formed on an outer peripheral surface of the side support roller 150. The fourth coating layer 764 increases the friction coefficient of the outer peripheral surface of the side support roller 150. The fourth coating layer 764 may be disposed on the outer peripheral surface of the side support roller 150 in contact with the inner surface of the display panel 120. The inner surface of the second area 122 of the display panel 120 may come into contact with the fourth coating layer 764 without coming into direct contact with the side support roller 150.

A friction coefficient between the third coating layer 763 and the fourth coating layer 764 may be greater than a friction coefficient between the display panel 120 and the side support roller 150. The fourth coating layer 764 may be formed of at least one of rubber or silicone, and the friction coefficient between the third coating layer 763 and the fourth coating layer 764 may be greater than the, friction coefficient between the display panel 120 and the side support roller 150. Accordingly, when the display panel 120 is slid (or slides) and the side support roller 150 comes into contact with the inner surface of the display panel 120 and rotates while supporting the display panel 120, the third coating layer 763 formed on the inner surface of the display panel 120 comes into contact with the fourth coating layer 764 formed on the outer peripheral surface of the side support roller 150, and thus a frictional force between the display panel 120 and the side support roller 150 may increase.

Meanwhile, although the slidable display device 700 of FIG. 7 is described as including all of the first coating layer 761, the second coating layer 762, the third coating layer 763, and the fourth coating layer 764, the present disclosure is not limited thereto, the slidable display device 700 may include only some of the first coating layer 761, the second coating layer 762, the third coating layer 763, and the fourth coating layer 764. For example, the slidable display device 700 may include only the first coating layer 761 and the second coating layer 762, or only the first coating layer 761, the second coating layer 762, and the third coating layer 763.

In the slidable display device 700 according to an exemplary embodiment of the present disclosure, the friction coefficient between the first coating layer 761 formed on each of the outer peripheral surfaces of the plurality of drive rollers 130 and the second coating layer 762 formed on each of the outer peripheral surfaces of the plurality of support rollers 140 may be greater than the friction coefficients between the plurality of drive rollers 130 and the plurality of support rollers 140. Accordingly, while the plurality of drive rollers 130 and the plurality of support rollers 140 rotate in a state of being engaged with each other, sliding (or slipping) or a phenomenon in which gears are dislocated may be reduced.

The friction coefficient between the second coating layer 762 formed on each of the outer peripheral surfaces of the plurality of support rollers 140 and the third coating layer 763 formed on the inner surface of the display panel 120 may be greater than the friction coefficients between the plurality of support rollers 140 and the display panel 120. Accordingly, while the display panel 120 is slid (or slides) by rotation of the plurality of support rollers 140, a phenomenon that the display panel 120 slips or the plurality of support rollers 140 rotate ineffectually may be reduced (or minimized).

The friction coefficient between the third coating layer 763 formed on the inner surface of the display panel 120 and the fourth coating layer 764 formed on the outer peripheral surface of the side support roller 150 may be greater than the friction coefficient between the display panel 120 and the side support roller 150. Accordingly, a phenomenon that the side support roller 150 rotates ineffectually without rotating on the display panel 120 while the display panel 120 is being slid may be reduced (or minimized).

Thus, the slidable display device 700 according to an exemplary embodiment of the present disclosure includes the first coating layer 761, the second coating layer 762, the third coating layer 763, and the fourth coating layer 764, and thus the plurality of drive rollers 130, the plurality of support rollers 140, and the side support roller 150 may properly rotate and the display panel 120 may be effectively slid. Accordingly, sliding stability of the slidable display device 700 may increase, or be improved.

Figure 8:
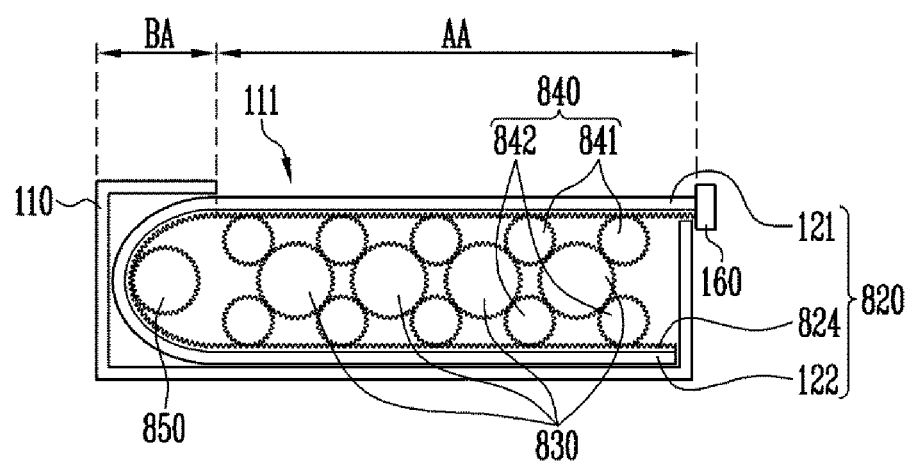
FIG. 8 is a cross-sectional view of a slidable display device according to an exemplary embodiment of the present disclosure.

FIG. 8 is a cross-sectional view of a slidable display device 800 according to an exemplary embodiment of the present disclosure. The slidable display device 800 of FIG. 8 is substantially the same as the slidable display device 100 of FIGS. 1-6, except that a display panel 820, a plurality of drive rollers 830, a plurality of support rollers 840, and a side support roller 850 are different. As such, duplicate descriptions of like elements may be omitted.

Referring to FIG. 8, gears may be formed on outer peripheral surfaces of the plurality of drive rollers 830 and the plurality of support rollers 840, and the gears of the plurality of drive rollers 830 may be engaged with the gears of the plurality of support rollers 840. For example, gears may be formed on the outer peripheral surfaces of the plurality of drive rollers 830, the plurality of upper support rollers 841, and the plurality of lower support rollers 842, respectively. The gears of the plurality of drive rollers 830 may be engaged with the gears of the plurality of upper support rollers 841, and the gears of the plurality of drive rollers 830 may be engaged with the gears of the plurality of lower support rollers 842.

The display panel 820 may be formed with gear 824 on an inner surface (or lower surface) thereof in contact with the plurality of support rollers 840. When the second area 122 is stored in the housing 110, the first area 121 may be in contact with the plurality of upper support rollers 841, and the second area 122 may be in contact with the side support roller 850 and the plurality of lower support rollers 842. The gear 824 may be formed on the inner surface of the display panel 820 in contact with the plurality of upper support rollers 841, the plurality of lower support rollers 842, and the side support roller 850. The gear 824 formed on the inner surface of the display panel 820 may be engaged with the gears of the plurality of lower support rollers 842 and may be engaged with the gears of the plurality of upper support rollers 841. Accordingly, when the plurality of support rollers 840 rotate, the display panel 820 may be effectively slid by the gear 824 of the display panel 820 engaged with the gears of the plurality of support rollers 840.

A gear may be formed on an outer peripheral surface of the side support roller 850. The gear may be formed on the outer peripheral surface of the side support roller 850 in contact with the inner surface of the display panel 820, and the gear of the side support roller 850 may be engaged with the gear 824 formed on the inner surface of the display panel 820. Thus, when the display panel 820 is slid (or slides), the side support roller 850 may be effectively rotated by the gear of the side support roller 850 engaged with the gear 824 of the display panel 820.

A slidable display device 800 according to an exemplary embodiment of the present disclosure is formed with gears on outer peripheral surfaces of the plurality of drive rollers 830 and the plurality of support rollers 840, and the gears of the plurality of drive rollers 830 may be engaged with the gears of the plurality of support rollers 840. Thus, when the plurality of drive rollers 830 rotate, the plurality of support rollers 840 may rotate with minimum slipping (or reduced slipping) and may rotate with effective coupling with the plurality of drive rollers 830.

The slidable display device 800 according to still another exemplary embodiment of the present disclosure may be formed with the gear 824 on the inner surface of the display panel 820 in contact with the plurality of support rollers 840 and the side support roller 850. The gear 824 formed on the inner surface of the display panel 820 may be engaged with the gears formed on the outer peripheral surfaces of the plurality of support rollers 840. Thus, when the plurality of support rollers 840 rotate and the display panel 820 is slid (or slides), slipping between the inner surface of the display panel 820 and the outer peripheral surfaces of the plurality of support rollers 840 may be reduced (or minimized), and the display panel 820 may be slid stably.

In addition, the slidable display device 800 according to an exemplary embodiment of the present disclosure is formed with the gear on the outer peripheral surface of the side support roller 850, and the gear of the side support roller 850 may be engaged with the gear 824 formed on the inner surface of the display panel 820. Thus, when the display panel 820 is slid (or slides) and the side support roller 850 rotates while supporting the display panel 820, slipping between the side support roller 850 and the display panel 820 may be reduced (or minimized) and the side support roller 850 may rotate stably.

Meanwhile, the first to fourth coating layers 761, 762, 763, and 764 of FIG. 7 may be applied to the slidable display device 800 of FIG. 8. For example, each of the first coating layer 761 and the second coating layer 762 of FIG. 7 may be formed on each of the outer peripheral surfaces of the plurality of drive rollers 830 and the plurality of support rollers 840 of the slidable display device 800 of FIG. 8. The third coating layer 763 of FIG. 7 may be formed on a surface of the gear 824 formed on the inner surface of the display panel 820 of FIG. 8. In addition, the fourth coating layer 764 of FIG. 7 may be formed on the surface of the gear formed on the outer peripheral surface of the side support roller 850 of FIG. 8. For example, a frictional force between the plurality of drive rollers 830 and the plurality of support rollers 840, a frictional force between the plurality of support rollers 840 and the inner surface of the display panel 820, and a frictional force between the inner surface of the display panel 820 and the side support roller 850 may increase. Thus, engaging between the plurality of drive rollers 830, the plurality of support rollers 840, the display panel 820, and the side support roller 850 may be strengthened, and sliding stability of the display panel 820 may be improved.

The foregoing description exemplifies and explains examples embodiments of the present disclosure. In addition, the foregoing description merely illustrates and explains exemplary embodiments of the present disclosure, and as described above, the present disclosure may be used in various other combinations, modifications, and environments and may be changed or modified within the scope of the inventive concepts disclosed in the present specification, within the scope of equivalents to the disclosure described above and/or within the skill or knowledge of persons of ordinary skill in the art. Accordingly, the foregoing is not intended to limit the present disclosure to the described exemplary embodiments. In addition, the appended claims should be construed to include other exemplary embodiments and equivalents.

What is claimed is:

1. A slidable display device comprising:
    a display panel comprising:
        a first area; and
        a second area extending from a first side of the first area;
    a housing defining an opening at an upper portion thereof and configured to store the second area;
    a plurality of drive rollers inside the housing;
    a plurality of support rollers comprising:
        a plurality of upper support rollers between the plurality of drive rollers and the opening; and
        a plurality of lower support rollers between the plurality of drive rollers and a lower surface of the housing; and
        a side support roller between the plurality of drive rollers and a side surface of the housing,
    wherein the first area is on the plurality of upper support rollers and is exposed to the outside through the opening when the second area is stored in the housing,
    wherein when the second area is stored in the housing, the second area is bent to a lower portion of the first area to face the lower portion of the first area and is between the side support roller and the side surface of the housing and between the plurality of lower support rollers and the lower surface of the housing, and wherein the first area is configured to slide by rotating the plurality of drive rollers such that at least a portion of the second area adjacent to the first area is exposed to the outside through the opening or is stored inside the housing.

2. The slidable display device of claim 1,
wherein the first area and the at least a portion of the second area that is exposed to the outside through the opening define a display area, and
wherein the display area is adjusted in area as the at least a portion of the second area is exposed outside of the housing or stored inside the housing.

3. The slidable display device of claim 2, wherein the first area and the at least a portion of the second area that is exposed to the outside define one display area.

4. The slidable display device of claim 3, wherein the display area is configured to display one image or a plurality of divided images.

5. The slidable display device of claim 1,
wherein the first area comprises a rigid substrate or a flexible substrate, and
wherein the second area comprises a flexible substrate.

6. The slidable display device of claim 1,
wherein the first area comprises a second side and a third side that are adjacent to the first side and face each other, and
wherein the plurality of drive rollers, the plurality of support rollers, and the side support roller are each located in a first roller area adjacent to the second side and a second roller area adjacent to the third side.

7. The slidable display device of claim 1, wherein each of the plurality of drive rollers is connected to one motor.

8. The slidable display device of claim 1, wherein respective ones of the plurality of drive rollers are connected to different motors.

9. The slidable display device of claim 1, wherein the plurality of drive rollers and the plurality of support rollers are alternately arranged along a sliding direction in which the first area is configured to slide, and are coupled with each other.

10. The slidable display device of claim 9,
wherein the display panel is in contact with the plurality of support rollers except for the plurality of drive rollers, and
wherein the plurality of support rollers transfers rotational forces of the plurality of drive rollers to the display panel.

11. The slidable display device of claim 9,
wherein when the plurality of drive rollers rotate in a first direction, the plurality of support rollers rotate in a second direction opposite to the first direction, and the at least a portion of the second area is exposed to the outside through the opening, and
wherein when the plurality of drive rollers rotate in the second direction, the plurality of support rollers rotate in the first direction, and the at least a portion of the second area is stored inside of the housing through the opening.

12. The slidable display device of claim 9,
wherein the plurality of drive rollers and the plurality of support rollers each comprise gears on outer peripheral surfaces thereof, respectively,
wherein the gears of the plurality of drive rollers and the gears of the plurality of upper support rollers are engaged with each other, and
wherein the gears of the plurality of drive rollers and the gears of the plurality of lower support rollers are engaged with each other.

13. The slidable display device of claim 12,
wherein the display panel comprises a gear on an inner surface thereof and in contact with the plurality of support rollers, and
wherein the gear of the display panel is engaged with the gears of the plurality of support rollers.

14. The slidable display device of claim 13,
wherein the side support roller comprises a gear on an outer peripheral surface thereof, and
wherein the gear of the side support roller and the gear of the display panel are engaged with each other.

15. The slidable display device of claim 1, wherein the side support roller is independent of the plurality of drive rollers and the plurality of support rollers.

16. The slidable display device of claim 1, further comprising:
a first coating layer on each of outer peripheral surfaces of the plurality of drive rollers in contact with the plurality of support rollers; and
a second coating layer on each of outer peripheral surfaces of the plurality of support rollers in contact with the plurality of drive rollers,
wherein a friction coefficient between the first coating layer and the second coating layer is greater than friction coefficients between the plurality of drive rollers and the plurality of support rollers.

17. The slidable display device of claim 16, further comprising:
a third coating layer on an inner surface of the display panel in contact with the plurality of support rollers and the side support roller; and
a fourth coating layer on an outer peripheral surface of the side support roller in contact with the display panel,
wherein a friction coefficient between the third coating layer and the fourth coating layer is greater than a friction coefficient between the display panel and the side support roller, and
wherein a friction coefficient between the third coating layer and the second coating layer is greater than friction coefficients between the display panel and the plurality of support rollers.

18. The slidable display device of claim 17, wherein the first coating layer, the second coating layer, the third coating layer, and the fourth coating layer are formed of at least one of rubber or silicone.

\* \* \* \* \*